United States Patent [19]
Yamamoto et al.

[11] Patent Number: 5,466,962
[45] Date of Patent: Nov. 14, 1995

[54] LIGHT-RECEIVING SEMICONDUCTOR DEVICE WITH PLURAL BURIED LAYERS

[75] Inventors: Motohiko Yamamoto; Masaru Kubo, both of Nara, Japan

[73] Assignee: Sharp Kabushiki Kaisha, Japan

[21] Appl. No.: 227,878

[22] Filed: Apr. 15, 1994

[30] Foreign Application Priority Data

Apr. 19, 1993 [JP] Japan .................... 5-091269

[51] Int. Cl.$^6$ ............................. H01L 27/14; H01L 31/00
[52] U.S. Cl. .................... 257/437; 257/446; 257/465; 257/464; 257/443
[58] Field of Search ................... 257/446, 448, 257/443, 465, 464, 463, 437

[56] References Cited

U.S. PATENT DOCUMENTS

| | | | |
|---|---|---|---|
| 4,238,760 | 12/1980 | Carr | 257/443 |
| 4,366,377 | 12/1982 | Notthoff et al. | 257/446 |
| 5,162,887 | 11/1992 | Dierschke | 257/463 X |
| 5,177,581 | 1/1993 | Kubo et al. | 257/437 |

FOREIGN PATENT DOCUMENTS

| | | |
|---|---|---|
| 63-138784 | 6/1988 | Japan . |
| 63-187426 | 12/1988 | Japan . |
| 02246168 | 10/1990 | Japan . |
| 3262167 | 11/1991 | Japan .................... 257/446 |

Primary Examiner—William Mintel
Attorney, Agent, or Firm—Nixon & Vanderhye

[57] ABSTRACT

A light-receiving semiconductor device with improved light sensitivity. On a semiconductor substrate of a first conductivity type is formed a plurality of buried layers of a second conductivity type divided by a narrow dividing region. A surface semiconductor layer of the first conductivity type covers the buried layers and the substrate. A connecting semiconductor region of the second conductivity type extends from each of the plurality of the buried layers to the surface of the surface semiconductor layer. An anti-light-reflecting film formed on the surface of the surface semiconductor layer covers a region above the dividing region as well as above the plurality of buried layers. Each of the plurality of buried layers forms a light responsive element with the substrate.

8 Claims, 11 Drawing Sheets

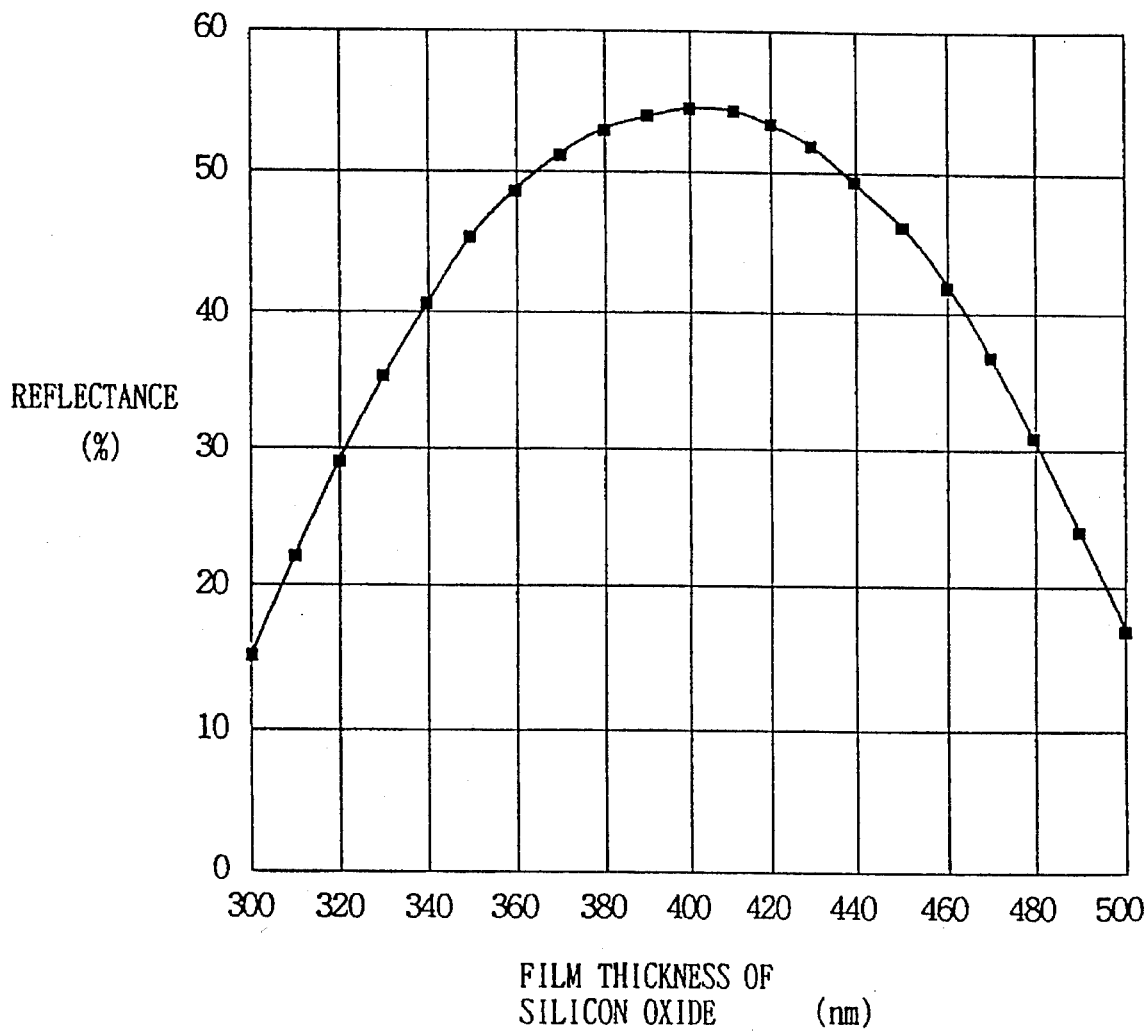

LIGHT-RECEIVING SEMICONDUCTOR DEVICE WITH PLURAL BURIED LAYERS

BACKGROUND OF THE INVENTION

The present invention relates to a light-receiving semiconductor device including light responsive elements such as split photodiodes used in an optical pickup, and more particularly, to a structure for reducing light surface reflectance in the proximity of a dividing region.

Split photodiodes are used for detecting a light signal in, for example, an optical pickup. FIG. 9 shows a sectional view of conventional two-split photodiodes. Two sets of such 2-split photodiodes are provided in parallel to obtain a 4-split photodiode.

According to a method of manufacturing the split photodiodes shown in FIG. 9, a silicon substrate including a plurality of N-type silicon layers 1 and 2 is provided. In general, an N⁻ type epitaxial layer 2 is grown on an N⁺ type silicon layer 1. Alternatively, N⁺ diffusion layer 1 may be formed from the bottom of an N⁻ type silicon layer 2. A pattern of a $SiO_2$ film 7 is formed on N⁻ type silicon layer 2. Using this pattern of $SiO_2$ film 7 as a mask, a plurality of P⁺ type anode layers 9 are formed at the surface of N⁻ type silicon layer 2. Anode layer 9 is covered by an anti-light-reflecting film of a silicon nitride film 8.

FIG. 10 shows a plan view of 6-split photodiodes used in a conventional optical pickup. Referring to FIG. 10, the middle four photodiodes 10a, 10b, 10c and 10d are used for detecting a focus signal. The two diodes 10e and 10f at both sides are used for detecting a tracking signal.

FIG. 11 shows a plan view of 5-split photodiodes used in an optical pickup employing a hologram. The left middle two photodiodes 11a and 11b are used for detecting a focus signal and a reproduced signal. The right middle photodiode 11c is used for detecting a reproduced signal. The two outside photodiodes 11d and 11e are used for detecting a tracking signal.

FIG. 12 schematically shows the arrangement of the main components in an optical pickup employing a hologram. Referring to FIG. 12, light emitted from a laser diode 13 sequentially passes through a hologram 14, a collimator lens 15, and an objective lens 16 to be focused on a record surface of an optical disk 17. Light reflected from optical disk 17 passes through objective lens 16, collimator lens 15, and hologram 14 to be focused on split photodiodes 18 such as those shown in FIG. 11.

Referring to FIGS. 13A, 13B and 13C, astigmatism is described as an example of a method of detecting focus error using 4-split photodiodes. The 4-split photodiodes include a pair of photodiodes 13a and 13d located adjacent in one diagonal direction, and another pair of photodiodes 13b and 13c adjacent in another diagonal direction. These four photodiodes are separated from each other by a dividing region D. A light beam projected on the 4-split photodiodes is represented as a spot 20. The shape of light spot 20 varies depending on focus error.

FIG. 13A shows light spot 20 on split photodiodes when the focus point is properly on the record surface of the optical disk. FIG. 13B shows light spot 20 on 4-split photodiodes when the record surface of the optical disk is closer than the focus point. FIG. 13C shows a light spot 20 on 4-split photodiodes when the record surface of the optical disk is farther than the focus point.

In general, the outputs of the first pair of photodiodes 13a and 13d adjacent in a first diagonal direction are summed. Similarly, the outputs of the second pair of photodiodes 13b and 13c adjacent in a second diagonal direction are summed. The difference between the summed outputs of the two pairs of photodiodes is detected as a focus error signal.

More specifically, a focus error output signal S is expressed by the following equation:

$$S=\{(\text{output signal of photodiode } 13a)+(\text{output signal of photodiode } 13d)\}-\{(\text{output signal of photodiode } 13b)+(\text{output signal of photodiode } 13c)\} \quad (1)$$

If S=0, the record surface of the optical disk is at the proper focus point. If S>0, the record surface of the optical disk is closer than the focus point. If S<0, the record surface of the optical disk is farther than the focus point.

It is appreciated from light spot 20 in FIGS. 13A–13C that a major portion of the signal optical beam is projected onto dividing region D.

A major portion of the light-receiving plane of P⁺ type anode region 9 is covered with an anti-light-reflecting film of a silicon nitride film as shown in FIG. 9. There is an PN junction between dividing region D and anode region 9. If a silicon nitride film is formed on the surface of a semiconductor across a PN junction, surface leak current across that PN junction increases. Therefore, a $SiO_2$ film 7 is left on the PN junction between dividing region D and its relevant sides. It is difficult to reduce the width of dividing region D and $SiO_2$ film 7 in view of positioning between dividing region D and the overlying $SiO_2$ film 7.

An $SiO_2$ film has a light reflectance greater than that of a silicon nitride film. Therefore, the intensity of an incident light signal into the silicon layer in the proximity of dividing region D is reduced.

FIG. 14 shows the light reflectance of a silicon oxide film formed on a silicon layer. The thickness of the silicon oxide film (nm) is plotted along the abscissa, and light reflectance (%) is plotted along the ordinate. The wavelength X of incident light is 780 nm.

FIG. 15 is similar to FIG. 14 provided that light reflectance of a stacked portion of a silicon oxide film and a silicon nitride film is shown. The silicon nitride film has a uniform thickness of 100 nm, and the wavelength λ of incident light is 780 nm.

In FIGS. 14 and 15, the silicon oxide film or the silicon nitride film is in direct contact with air. In other words, the medium of incident light is air.

The maximum light reflectance is greater than 25 % in either cases of FIGS. 14 and 15. Therefore, in split photodiodes having a conventional structure, sufficient light sensitivity can not be obtained, and it is difficult to obtain a detection signal having a sufficiently high signal-to-noise (S/N) ratio in an optical pickup.

SUMMARY OF THE INVENTION

In view of the foregoing, an object of the present invention is to provide a light-receiving semiconductor device having light sensitivity improved by reducing light reflectance in a dividing region between two or more photodiodes.

A light-receiving semiconductor device according to the present invention includes a semiconductor substrate of a first conductivity type, a plurality of buried layers of a second conductivity type formed on the substrate and divided by a narrow dividing region, a surface semiconductor layer of the first conductivity type covering the buried layers and the substrate, a connection semiconductor region of the second conductivity type extending from each of the buried layers to the surface of the surface semiconductor layer, and an anti-light-reflecting film formed on the surface of the surface semiconductor layer so as to cover a region above the dividing region as well as above the plurality of buried layers, wherein each of the plurality of buried layers of the second conductivity type forms a light responsive element with the substrate of the first conductivity type.

According to the light receiving semiconductor device of the present invention, a plurality of semiconductor regions of the second conductivity type serving as, for example, anodes, of split photodiodes are buried in the semiconductor substrate of the first conductivity type. The semiconductor substrate is covered with an anti-light-reflecting film at a region above the dividing region as well as above the anode region. Therefore, the surface light reflectance in the proximity of the dividing region can be reduced to improve the light sensitivity of a light-receiving semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a graph showing light reflectance by a stacked layer of a silicon oxide film and a silicon nitride film formed on a silicon layer.

DESCRIPTION OF THE PREFERRED EMBODIMENTS

Figure 1:
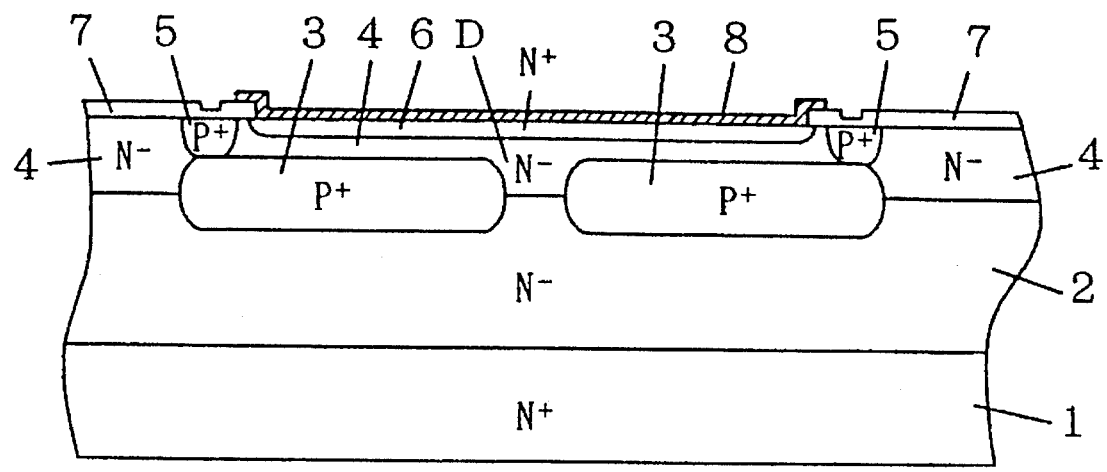
FIG. 1 is a schematic sectional view of a light receiving semiconductor device according to an embodiment of the present invention.

FIG. 1 schematically shows a light-receiving semiconductor device according to an embodiment of the present invention. The light-receiving semiconductor device of FIG. 1 differs from that of FIG. 9 in a plurality of $P^+$ type anode layers 3 buried between $N^-$ type epitaxial layers 2 and 4. The surface of $N^-$ type epitaxial layer 4 is covered with an anti-light-reflecting film 8 in the region above dividing region D as well as above the plurality of dividing anode regions 3. The light-receiving semiconductor device of FIG. 1 is formed by a process shown in FIGS. 2–4, for example.

Figure 2:
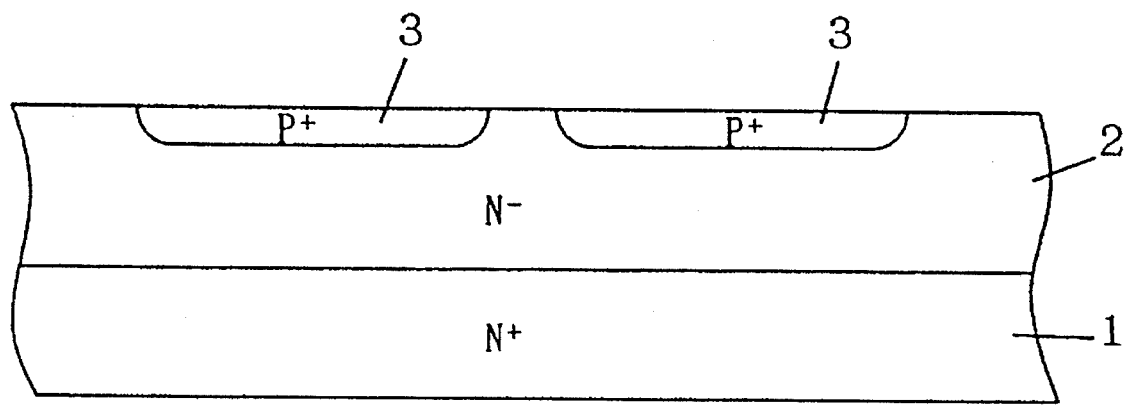
FIGS. 2, 3 and 4 are sectional views of the light-receiving semiconductor device of FIG. 1 illustrating a manufacturing process thereof.

Referring to FIG. 2, a first $N^-$ type epitaxial layer 2 is grown on an $N^+$ type silicon substrate 1. In general, first epitaxial layer 2 has a relatively high resistivity. A plurality of $P^+$ type anode layers 3 are formed at the surface of first epitaxial layer 2.

Figure 3:
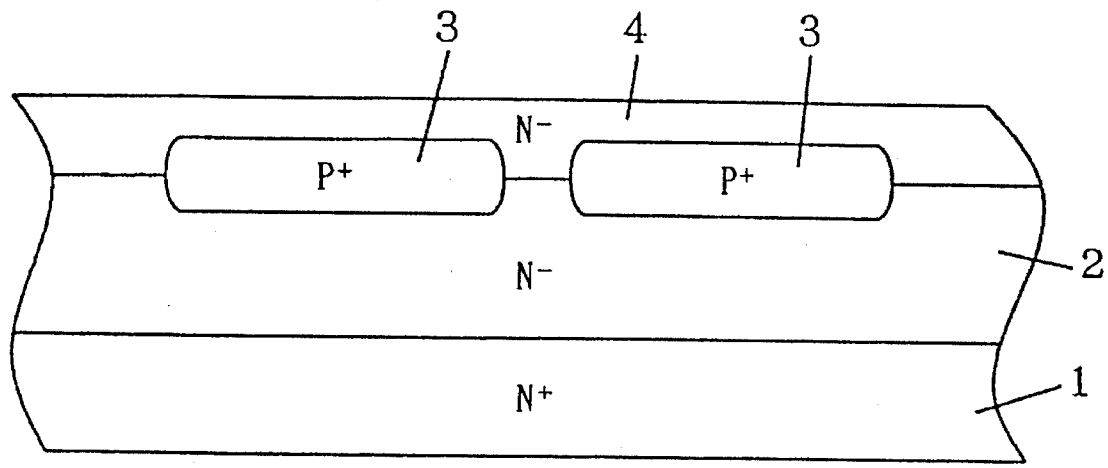

Referring to FIG. 3, a second $N^-$ type epitaxial layer 4 is grown so as to cover the plurality of anode regions 3 and first epitaxial layer 2. In general, second epitaxial layer 4 has a relatively high resistivity.

Figure 4:
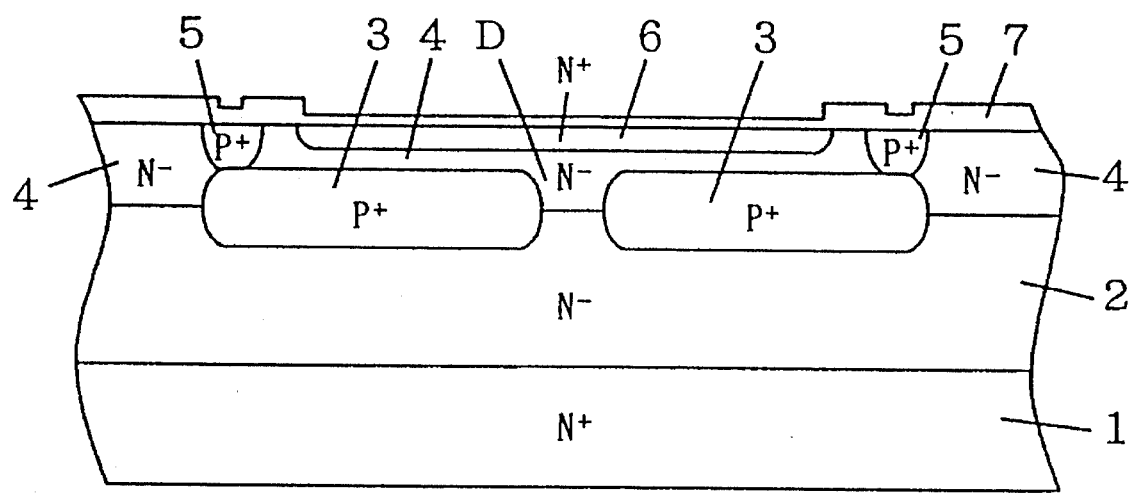

Referring to FIG. 4, a $P^+$ type connection semiconductor region 5 is formed to connect an anode electrode (not shown) to a corresponding one of the plurality of anode layers 3. More preferably, an $N^+$ type interfacial semiconductor layer 6 is formed at the surface of second epitaxial layer 4 above dividing region D as well as above the plurality of anode layers 3. An opening is formed in an $SiO_2$ film 7 above interfacial semiconductor layer 6. An anti-light-reflecting film 8 of a silicon nitride film is formed to cover that opening. Thus, the light-receiving semiconductor device of FIG. 1 is obtained.

In the light-receiving semiconductor device of FIG. 1, $N^+$ type interfacial semiconductor layer 6 serves to reduce carrier recombination of electrons and holes at the interface between the silicon layer and the silicon nitride film.

The structure of FIG. 1 allows the free surface of the semiconductor layer to be covered with a surface anti-light reflecting film 8 of a silicon nitride film above dividing region D as well as above dividing anode regions 3. Therefore, the amount of incident light into the silicon layer is increased to improve the signal detection sensitivity of an optical pickup signal.

Figure 9:
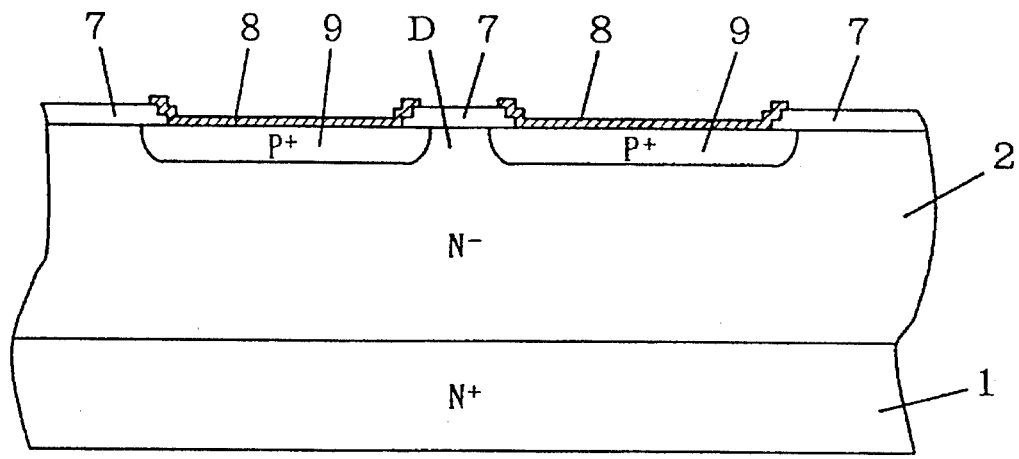
FIG. 9 is a sectional view of conventional split photodiode.
Figure 10:
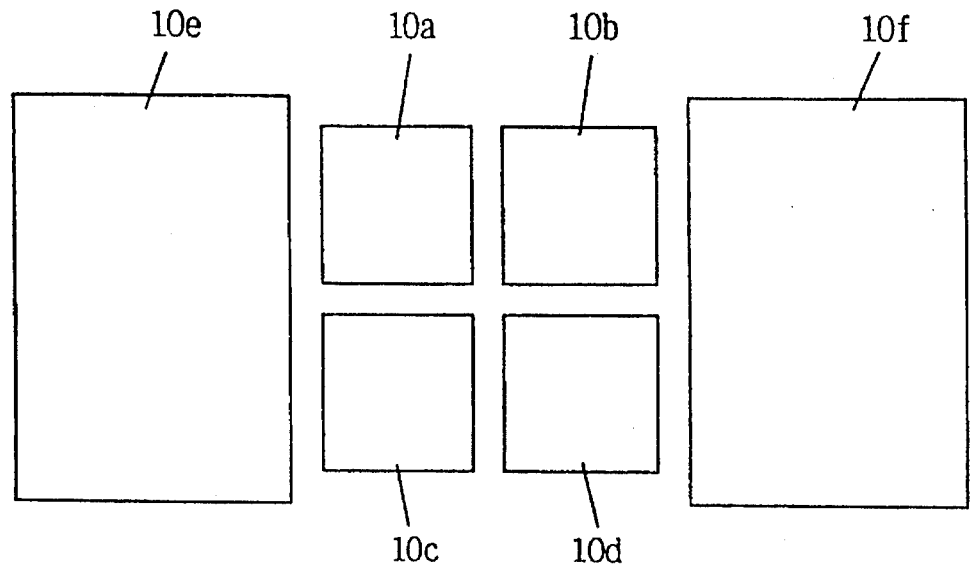
FIG. 10 is a plan view of another conventional 6-split photodiodes.

The structure of FIG. 1 eliminates the need of carrying out positioning between dividing region D and silicon oxide film 7 in contrast to the structure of FIG. 9. It is desirable to minimize the width of dividing region D under the restriction that the plurality of anode regions 3 do not come into contact laterally. For example, when the plurality of anode layers 3 are formed by diffusion with the expansion of each of the plurality of anode regions 3 being 1.5 µm laterally, the width of dividing region D is set to 4 µm at the designing stage of the photomask taking into consideration a margin of 1 µm for variation in the manufacturing process.

The value of the depth from the surface of silicon layer 4 to the bottom of anode layer 3 and the thickness of the depletion layer is desirably designed to be approximately $1/2\alpha$ to approximately $2/\alpha$, where $\alpha$ is the light absorption coefficient of silicon. When the wavelength $\lambda$ of light is 780 nm, $\alpha$ is 1200 cm$^1$, so that the value of $1/2\alpha$–$2/\alpha$ becomes 4.2 µm–16.6 µm. If the resistivity of $N^-$ type epitaxial layer 2 is 100 Ωcm and the reverse bias voltage of the photodiode is 3 V, the thickness of the depletion layer is approximately 9 µm. Therefore, the depth of the bottom of anode layer 3 is preferably more shallow than 16.6 µm–9 µm=7.6 µm.

Figure 5:
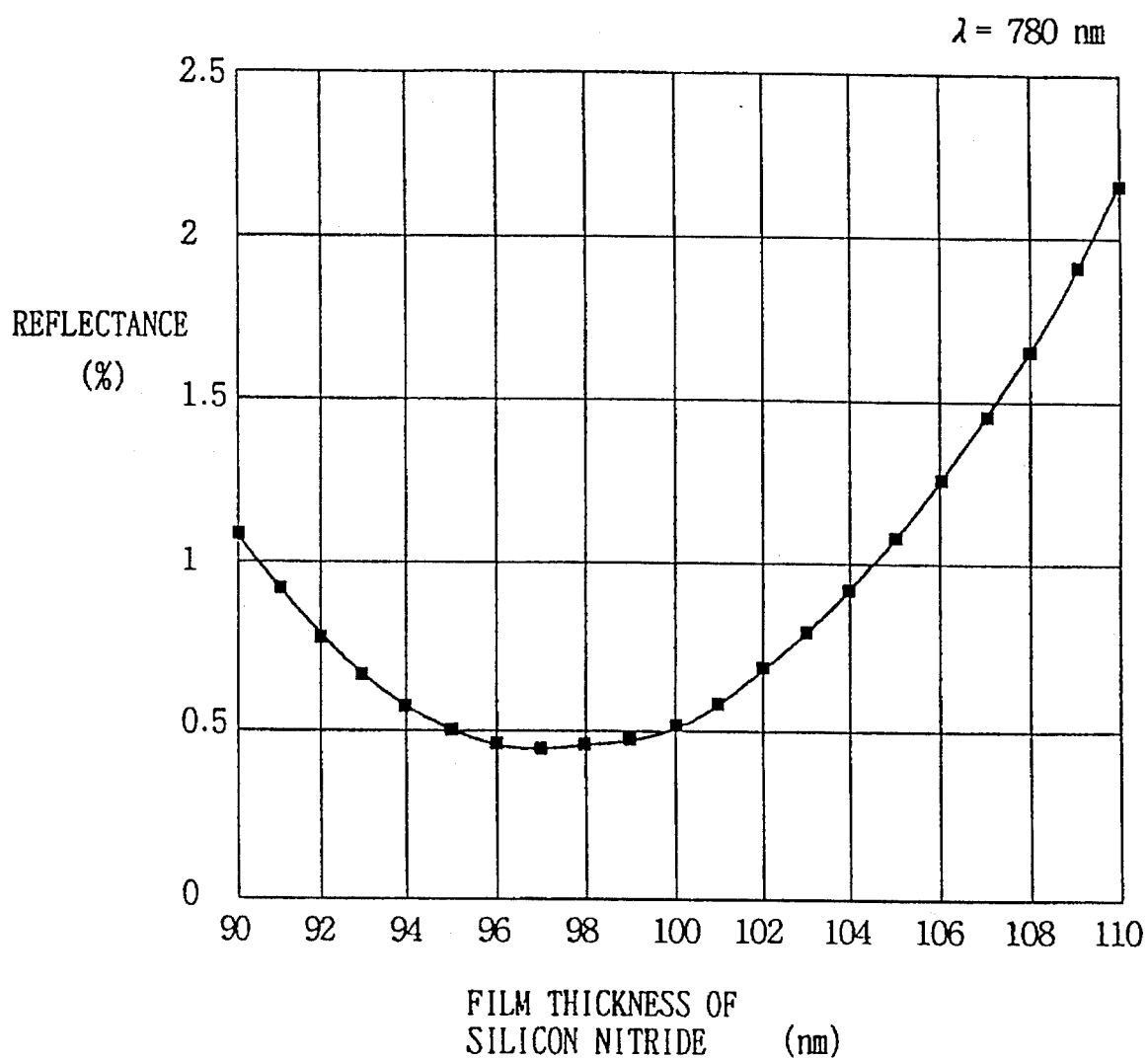
FIG. 5 is a graph showing the light reflectance of a silicon nitride film formed on a silicon layer.

FIG. 5 shows light reflectance of a silicon nitride film formed on a silicon layer. The thickness (nm) of the silicon nitride layer is plotted along the abscissa, and light reflectance is plotted along the ordinate. The used light has a wavelength of $\lambda$=780 nm. It is appreciated from FIG. 5 that the silicon nitride film can reduce the light reflectance of the silicon surface to the level of below 2.2%. FIG. 5 shows the reflectance when the medium of the incident light is air. Here, the optimum film thickness of the silicon nitride film is 98 nm.

Figure 6:
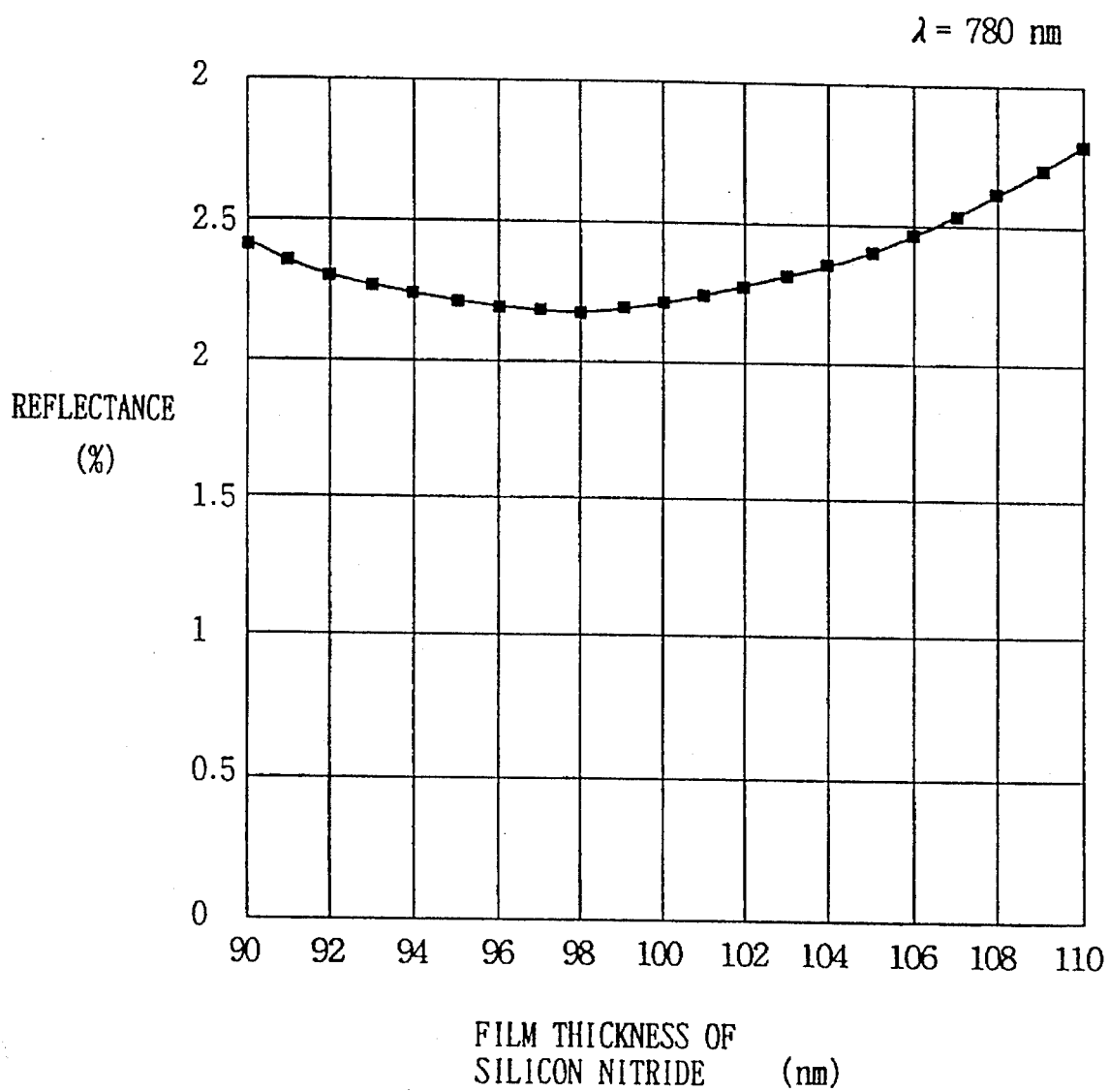
FIG. 6 is a graph showing the light reflectance of a silicon nitride film and a transparent organic film formed on a silicon layer.
Figure 7:
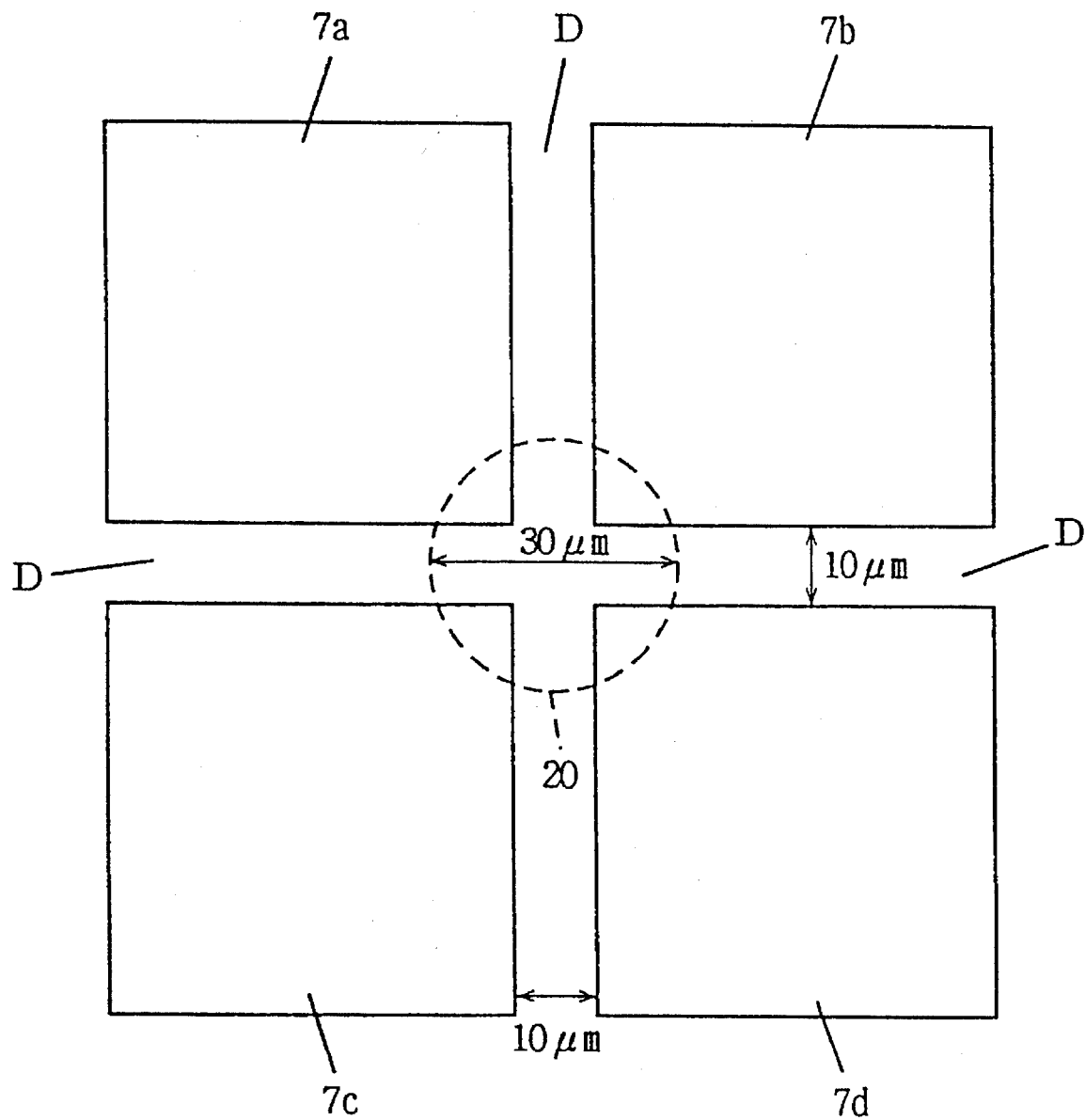
FIG. 7 is a top view of 4-split photodiodes for evaluating the effect of the present invention.

FIG. 6 is a graph similar to that of FIG. 5, provided that the silicon nitride film is in contact with a transparent resin having a refractive index of n=1.54. In other words, the medium of incident light is this transparent resin, and not air. This is appreciated from FIG. 6 that the reflectance, though slightly higher than in the case of FIG. 5, can be reduced to not more than 2.8% even when the medium of the incident light is a transparent resin. The optimum thickness of the nitride film is also 98 nm.

Figure 11:
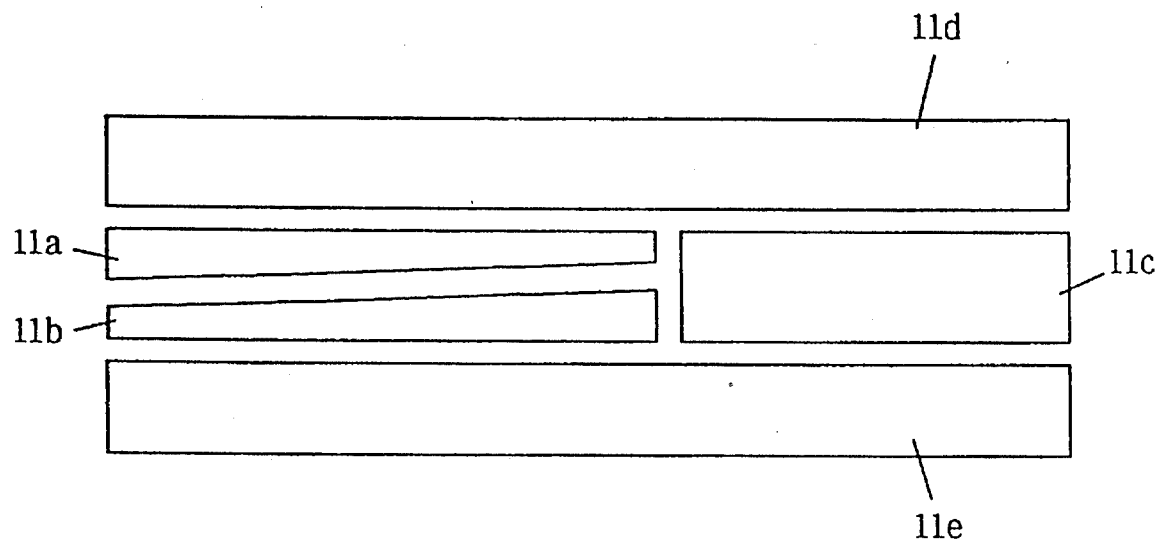
FIG. 11 is a plan view of 5-split photodiodes in an optical pickup employing hologram according to prior art.
Figure 12:
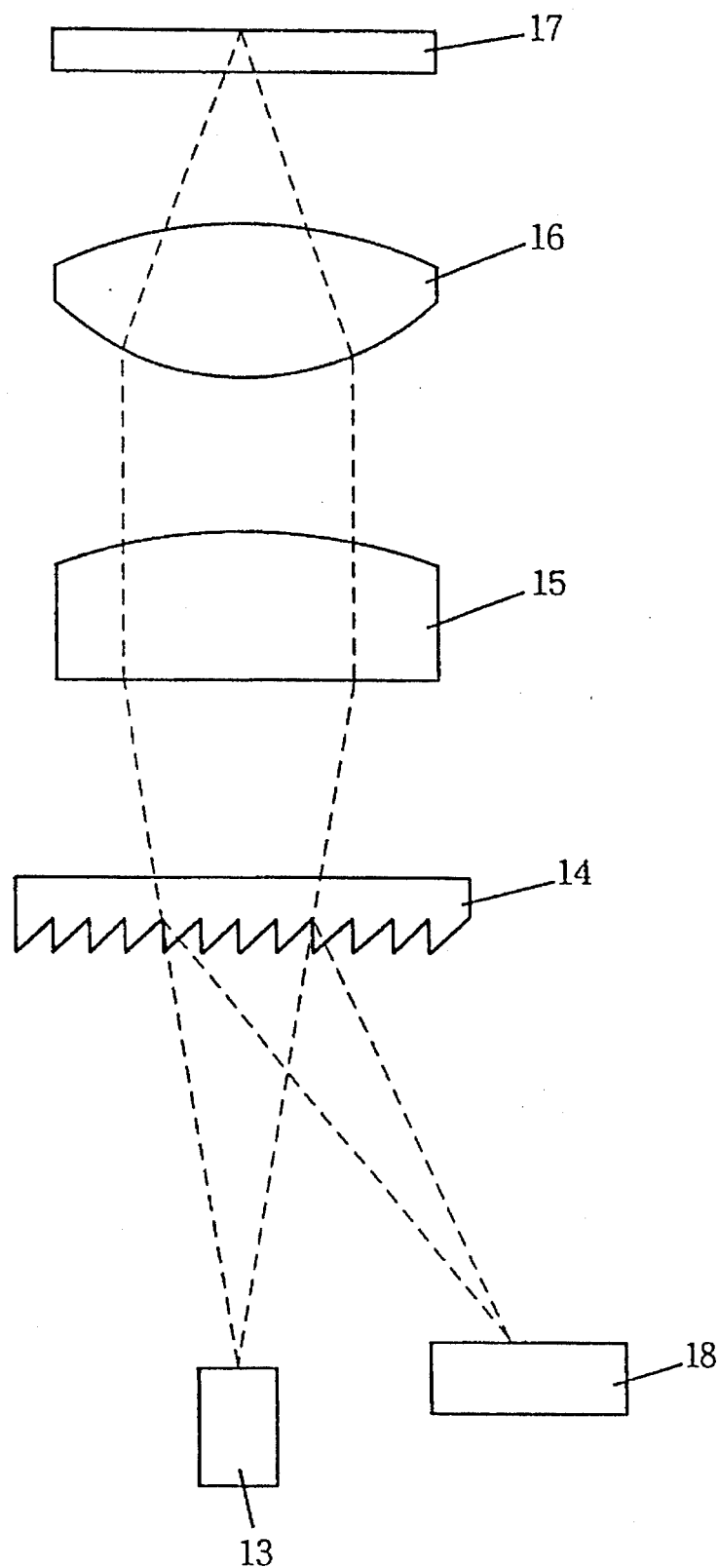
FIG. 12 is a diagram schematically showing the arrangement of main components in a conventional optical pickup employing hologram.
Figure 13A:
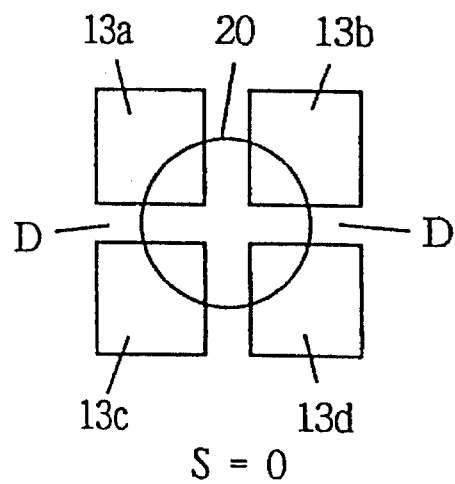
FIGS. 13A, 13B and 13C are plan views of 4-split photodiodes for describing a method of detecting focusing error.
Figure 13B:
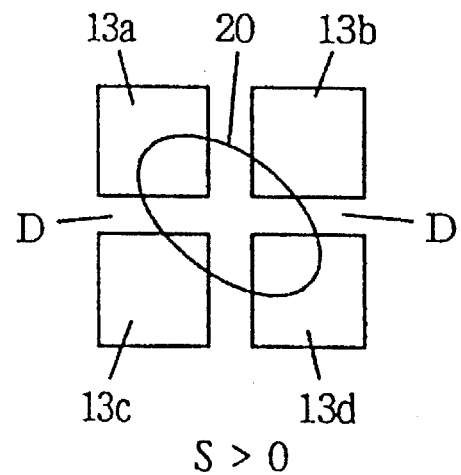
Figure 13C:
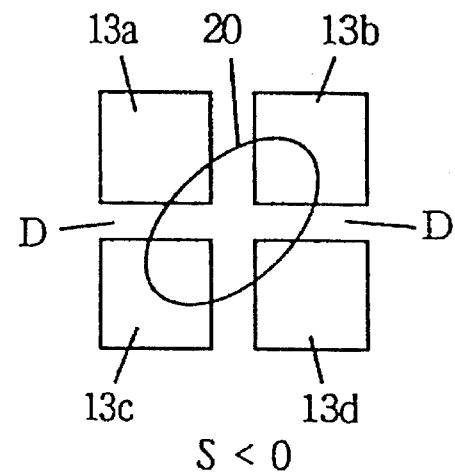

In split photodiodes shown in FIG. 11 used in a pickup employing hologram, the medium of incident light is air. It is therefore understood that the present invention is more effective in the case where the medium of incident light is air instead of a transparent resin from FIGS. 5 and 6. The present invention is particularly effective in an optical pickup employing a hologram.

A case is considered of improvement in light sensitivity according to the present invention when a light spot of 30 μm in diameter is projected onto the center of symmetric 4-split photodiodes. It is assumed that the intensity is uniform in light spot 20, and that dividing region D has a width of 10 μm. Under these conditions, the ratio of the portion of light spot 20 incident into split diodes 7a, 7b, 7c and 7d to the portion of light spot 20 incident into dividing region D is expressed by the following equation:

(dividing anode region):(dividing region)=1:2.2    (2)

Figure 14:
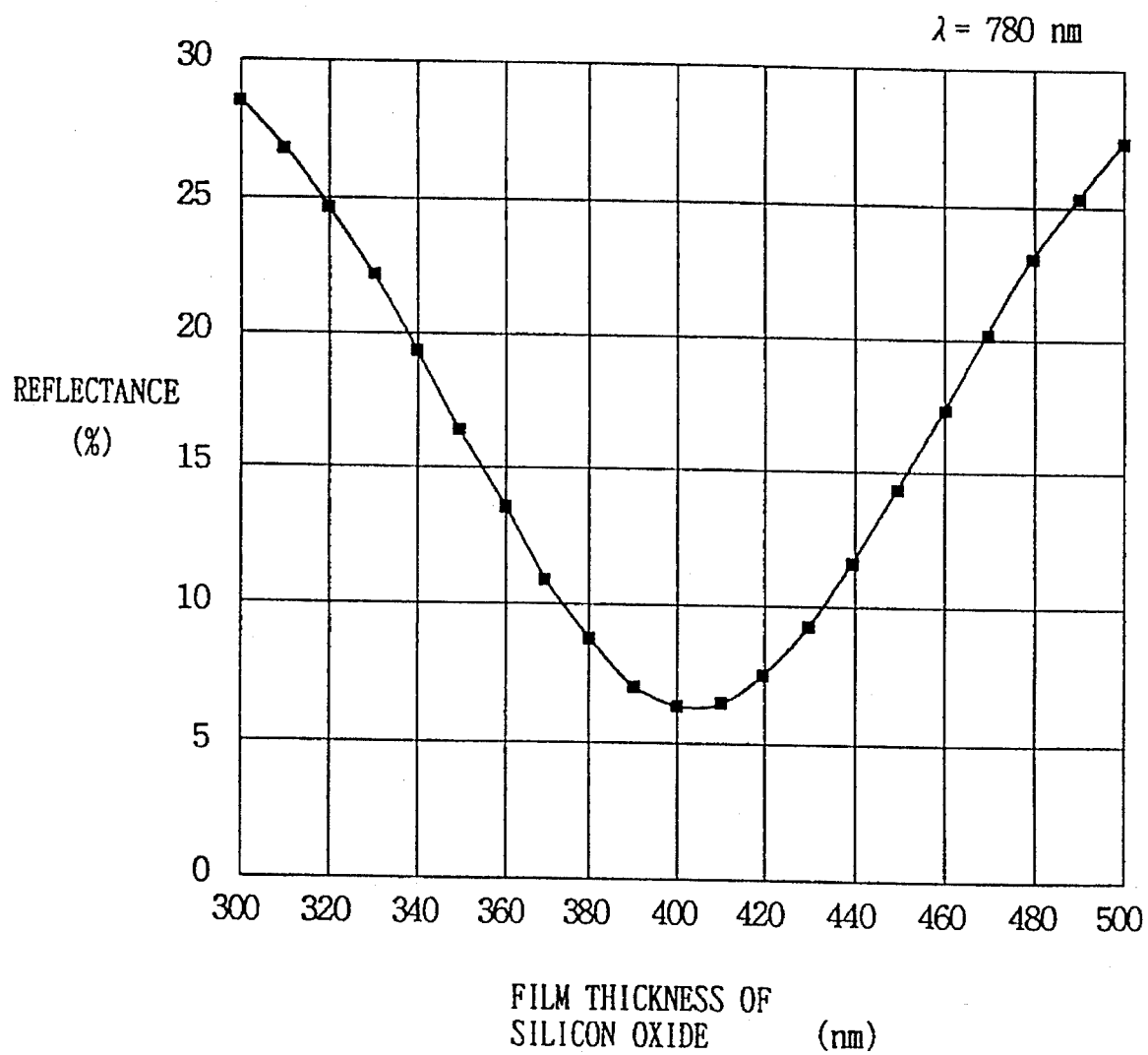
FIG. 14 is graph showing light reflectance of a silicon oxide film formed on a silicon layer.

Suppose the silicon oxide film has a thickness of 300 nm and the silicon nitride film has a thickness of 98 nm ignoring the stacked layered portion of silicon oxide film 7 and silicon nitride film 8 in a conventional light-receiving semiconductor device of FIG. 9. The ratio of reflected light to incident light is 20.4% according to the calculation on the basis of FIGS. 5, 14 and equation (2). In contrast, supposing that the silicon nitride film in the light-receiving semiconductor device of FIG. 1 is 98 nm, the ratio of reflected light to incident light is reduced to 0.45% as shown in FIG. 5. It is appreciated that the light reflectance is reduced by approximately 20%.

Although the present invention has been described in which $N^-$ type semiconductor layer 2 is an epitaxial layer grown on $N^+$ type silicon substrate 1, $N^+$ type silicon layer 1 may be formed by diffusion from the bottom of $N^-$ type silicon substrate 2. Alternatively, an $N^-$ type silicon substrate may be used instead of $N^+$ type silicon substrate 1 and $N^-$ type epitaxial layer 2. $N^-$ type epitaxial layers 2 and 4 do not necessarily require high resistivity if the increase of a junction capacitance is not a problem.

The light-receiving semiconductor device of the above embodiment includes a plurality of buried anode regions. That is to say, each anode of the split photodiodes has a shielded structure, so that a light-receiving semiconductor device does not easily operate erroneously even if external noise is entered. In contrast, an anode region exists at the surface of the semiconductor layer in a conventional light-receiving semiconductor device such as that shown in FIG. 9. Therefore, external noise will affect the output of the photodiode. If anode layer 3 is buried, external noise will enter the constant voltage side of the photodiode, so that the output is not influenced.

Furthermore, because the light-receiving semiconductor device of FIG. 1 has an $N^+$ type interfacial semiconductor layer 6 formed at the surface of silicon layer 4, carriers are prevented from approaching the surface of the silicon layer by internal potential. Therefore, carrier recombination at the interface of silicon layer 4 and silicon nitride film 8 is reduced to allow reduction of noise in an optical pickup.

Figure 8:
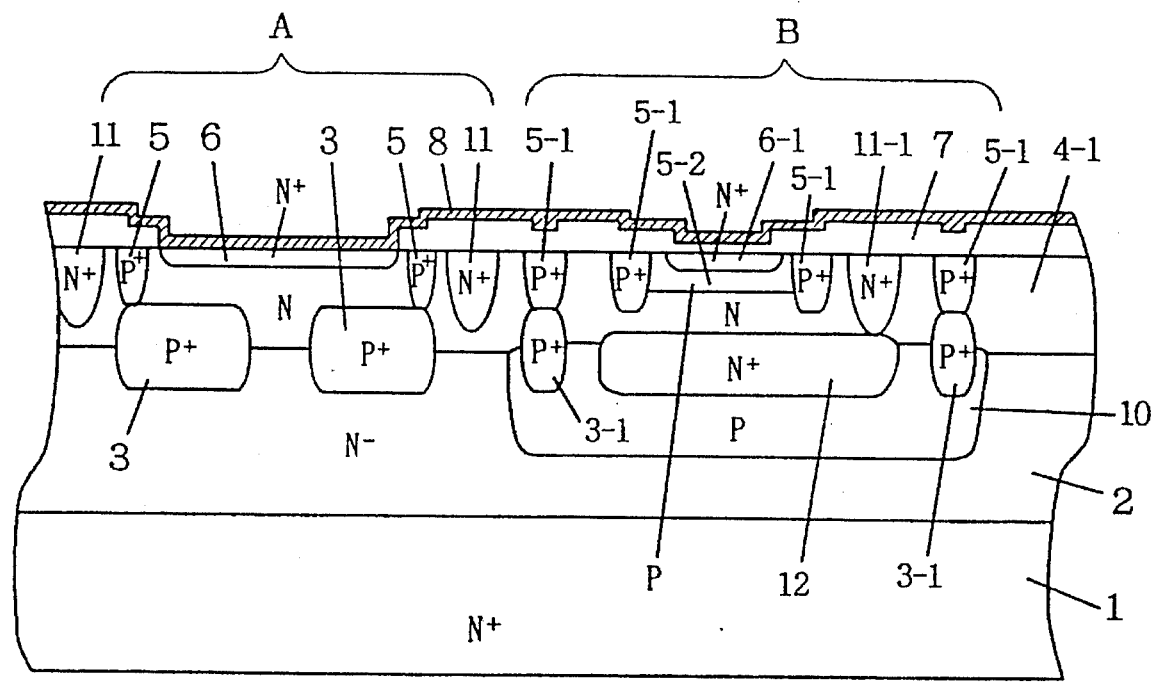
FIG. 8 is a schematic sectional view of a circuit built-in type light-receiving semiconductor device according to another embodiment of the present invention.

FIG. 8 shows a light-receiving semiconductor device according to another embodiment of the present invention. The light-receiving semiconductor device of FIG. 8 is formed having photodiodes and signal processing circuitry integrated on the same semiconductor substrate.

Reduction in size and cost of a light-receiving semiconductor device is achieved by forming photodiodes and signal processing circuitry on the same semiconductor substrate. Furthermore, resistance to external noise is improved by substituting the wire bonds connecting photodiodes and signal processing circuitry with wiring in the IC.

Referring to FIG. 8, a photodiode A is formed at the left side, and an NPN transistor B is formed at the right side. In FIG. 8, components corresponding to those in FIG. 1 have the same reference characters denoted.

Photodiode A of FIG. 8 is similar to that of FIG. 1, provided that silicon nitride film 8 further extends to a region above NPN transistor B. By using such an extended silicon nitride film 8, a capacitor (not shown) can be formed in a circuit connected to NPN transistor B. It is to be noted that $N^+$ type semiconductor region 11 shown at the left side in FIG. 8 serves as a cathode of photodiode A.

In NPN transistor B of FIG. 8, an $N^+$ buried layer 12 serving as a collector is formed in a P type buried layer 10 in a first epitaxial layer 2 of $N^-$ type. A $P^+$ type isolation region 3-1 is formed at both sides of P type buried layer 10. An N type epitaxial layer 4-1 is formed so as to cover P type buried layer 10, $N^+$ type collector layer 12, and $P^+$ type isolation layer 3-1. A plurality of $P^+$ type semiconductor regions 5-1 are formed from the surface of N type epitaxial layer 4-1. Each of $P^+$ type semiconductor regions 5-1 at the sides is connected to the underlying isolation region 3-1.

A P type base region 5-2 is formed between the two inner $P^+$ type semiconductor regions 5-1. An $N^+$ type emitter region 6-1 is formed at the surface of base region 5-2. An $N^+$ type connection semiconductor region 11-1 is formed connecting the surface of N type silicon layer 4-1 and buried collector layer 12.

In the light-receiving semiconductor device of FIG. 8, buried anode region 3 of the photodiode and $P^+$ type isolation region 3-1 at the periphery of the transistor can be formed at the same time. Furthermore, $P^+$ type semiconductor connection region 5 of the photodiode and $P^+$ type semiconductor region 5-1 in the transistor region can be formed at the same time. In other words, photodiodes and signal processing circuitry can be formed on the same semiconductor substrate in the light-receiving semiconductor device of FIG. 8 without an additional step in the manufacturing process of a bipolar IC.

Thus, according to the present invention, light sensitivity and noise resistance can be improved in a light-receiving semiconductor device. Therefore, the signal detection sensitivity and S/N ratio in an optical pickup can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light receiving semiconductor device, comprising:
    a semiconductor substrate of a rest conductivity type having a two dimensional surface defining a horizontal plane, a plurality of buried layers of a second conductivity type formed along said horizontal plane of said substrate and divided by a dividing region, a surface semiconductor layer of the first conductivity type covering said buried layers and said substrate, a connection semiconductor region of the second conductivity type extending from each of said plurality of buried layers to a surface of said surface semiconductor layer, and an anti-light-reflecting film formed on a surface of said surface semiconductor layer covering a region above said dividing region and extending above a substantial portion of each said plurality of buried layers, wherein said plurality of buried layers of the second conductivity type form plural light responsive elements with said substrate of the first conductivity type along said horizontal plane.

2. The light-receiving semiconductor device according to claim 1, further comprising an interfacial semiconductor layer of the first conductivity type having an impurity concentration higher than that of said surface semiconductor layer between said surface semiconductor layer and said anti-light-reflecting film.

3. The light-receiving semiconductor device according to claim 1, wherein said anti-light-reflecting film comprises a silicon nitride film.

4. The light-receiving semiconductor device according to claim 2, wherein said anti-light-reflecting film comprises a silicon nitride film.

5. The light-receiving semiconductor device according to claim 1, wherein a signal processing circuit is formed on said semiconductor substrate.

6. The light-receiving semiconductor device according to claim 2, wherein a signal processing circuit is formed on said semiconductor substrate.

7. The light-receiving semiconductor device according to claim 3, wherein a signal processing circuit is formed on said semiconductor substrate.

8. The light-receiving semiconductor device according to claim 4, wherein a signal processing circuit is formed on said semiconductor substrate.

* * * * *